US007650932B2

(12) United States Patent
Li

(10) Patent No.: US 7,650,932 B2
(45) Date of Patent: Jan. 26, 2010

(54) LOOP HEAT PIPE

(75) Inventor: Jia-Hao Li, Sindian (TW)

(73) Assignee: Jaffe Limited, Tortola (VG)

( * ) Notice: Subject to any disclaimer, the term of this patent is extended or adjusted under 35 U.S.C. 154(b) by 696 days.

(21) Appl. No.: 11/341,413

(22) Filed: Jan. 30, 2006

(65) Prior Publication Data

US 2007/0175616 A1    Aug. 2, 2007

(51) Int. Cl.
*H05K 7/20* (2006.01)
(52) U.S. Cl. ............. 165/104.33; 165/104.26; 361/700
(58) Field of Classification Search ........... 165/104.21, 165/104.26, 104.33; 361/700
See application file for complete search history.

(56) References Cited

U.S. PATENT DOCUMENTS

| 3,368,359 | A | * | 2/1968 | English et al. ............... 62/3.64 |
| 4,724,901 | A | * | 2/1988 | Munekawa ............. 165/104.21 |
| 4,921,041 | A | * | 5/1990 | Akachi ................. 165/104.29 |
| 6,681,840 | B1 | * | 1/2004 | Mok ........................... 165/46 |
| 6,789,611 | B1 | * | 9/2004 | Li ......................... 165/104.29 |
| 2002/0195230 | A1 | * | 12/2002 | Li ......................... 165/104.33 |
| 2003/0011990 | A1 | * | 1/2003 | Lai et al. .................... 361/697 |
| 2006/0011329 | A1 | * | 1/2006 | Wang et al. ............ 165/104.33 |
| 2006/0262505 | A1 | * | 11/2006 | Cheng ....................... 361/700 |
| 2007/0006992 | A1 | * | 1/2007 | Liu et al. ............... 165/104.26 |

FOREIGN PATENT DOCUMENTS

| JP | 57107062 A | * | 7/1982 |
| JP | 09148501 A | * | 6/1997 |
| TW | 92130196 | | 10/2003 |

\* cited by examiner

*Primary Examiner*—Allen J Flanigan
(74) *Attorney, Agent, or Firm*—Chun-Ming Shih

(57) ABSTRACT

A loop heat pipe includes an evaporator and a sealed pipe. The evaporator includes an evaporator body made of a heat conductive material. The evaporator body has at least two retaining holes and at least a channel hole penetrating the retaining holes. In addition, the sealed pipe includes at least two sealed ends. The two sealed ends are securely fastened to the two retaining holes of the evaporator. Meanwhile, at least one of the two retaining holes is a through hole, which penetrates through two sides of the evaporator body, and at least one of the sealed ends protrudes the evaporator via the penetrable retaining hole.

8 Claims, 3 Drawing Sheets

LOOP HEAT PIPE

BACKGROUND OF THE INVENTION

The present invention relates generally to a loop heat pipe, and more particularly to the evaporator of the loop heat pipe.

A loop heat pipe is a heat exchange system, wherein both the liquid and gas phase of the working fluid flows along the same direction. The working principle of the loop heat pipe is similar to that of the conventional heat pipe. However, the loop heat pipe does not comprise the drawback that the liquid phase of the working fluid flows along a direction opposite to that of the gas working fluid. Therefore, the performance of the loop heat pipe is much better than that of the conventional heat pipe.

One conventional loop heat pipe is disclosed in Taiwanese Patent Application No. 92130196, entitled "method for manufacturing evaporator of loop heat pipe." Although the primary subject matter disclosed in this application publication is a method for manufacturing the evaporator of a loop heat pipe, one can easily realize, by viewing the appended figures that the evaporator of a loop heat pipe is configured such that one side thereof is connected to an incoming pipe, while the other side thereof is connected to an outgoing pipe. After the pipes and the evaporator form a loop, it is very difficult to clean, evacuate or exhaust the internal part of the pipes. Therefore, the cleanness and the degree of vacuum of the pipes become uncontrollable, which will affect the performance of heat transfer. In addition, the evaporator of the application publication is composed of two external pipes, which requires an adhesion or a welding procedure to tightly connect the external pipes onto the evaporator. However, the adhesion or the welding procedure requires that the welding torch or the glue gun be surrounding the edge of the two external pipes. In this manner, the loop.heat pipe will interfere the welding or the adhesion procedure.

On the other hand, one can use a detachable torch to prevent the interference of the loop heat pipe during the welding procedure of the torch. However, the detachable torch requires additional steps for detaching and assembling the torch, which will largely slow down the production speed. Moreover, one can also use a soldering procedure to replace the welding procedure. However, the melted soldering material can flow into the pipe, which will be absorbed by the capillary structure, thereby clogging the capillary structure.

Accordingly, the inventor of the present invention realized the drawbacks in the conventional art, and developed the present invention that can overcome the drawbacks described above.

BRIEF SUMMARY OF THE INVENTION

The present invention is to provide a loop heat pipe, which can ease the operation for cleaning, evacuating or exhausting the loop heat pipe before sealing. In addition, the evaporator and the pipe body of the loop heat pipe of the present invention can be connected with fewer steps.

The loop heat pipe of the present invention includes an evaporator and a sealed pipe. The evaporator includes an evaporator body made of a heat conductive material. The evaporator body has at least two retaining holes and at least a channel hole penetrating the retaining holes. In addition, the sealed pipe includes at least two sealed ends. The two sealed ends are securely fastened to the two retaining holes of the evaporator. Meanwhile, at least one of the two retaining holes is a through hole, which penetrates through two sides of the evaporator body, and at least one of the sealed ends protrudes the evaporator via the penetrable retaining hole.

DETAILED DESCRIPTION OF THE INVENTION

In order to better understanding the features and technical contents of the present invention, the present invention is hereinafter described in detail by incorporating with the accompanying drawings. However, the accompanying drawings are only for the convenience of illustration and description, no limitation is intended thereto.

Figure 1:
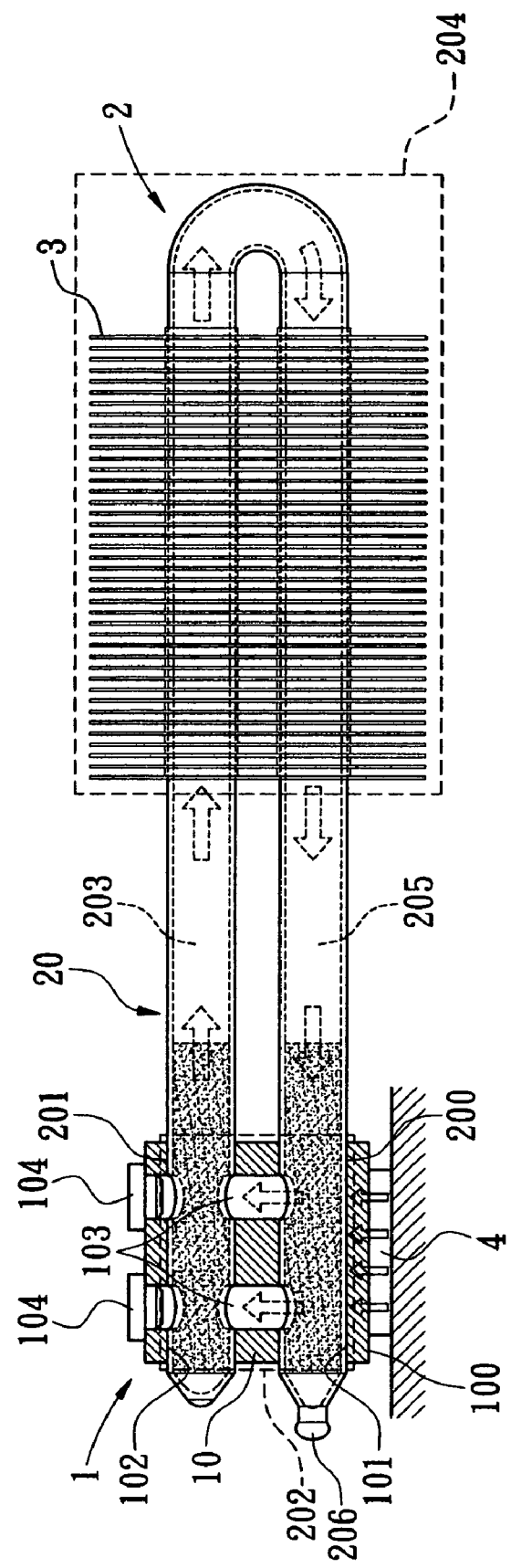
FIG. 1 is a sectional view illustrating a loop heat pipe, in accordance with the first embodiment of the present invention.

Referring to FIG. 1, a loop heat pipe in accordance with the first embodiment of the present invention is illustrated. As shown, the loop heat pipe includes an evaporator 1 and a sealed pipe 2.

The evaporator 1 is the portion that the loop heat pipe absorbs heat. The evaporator 1 includes a evaporator body 1 made of a heat conductive material, e.g. aluminum or copper. Therefore, the evaporator body 10 is substantially a heat spreader, which includes a contact surface 100 provided for contacting with a heat source 4. The heat source 4 is a heat generating electronic device. In one embodiment, the heat source 4 refers to the central processing unit. In addition, at least two retaining hole 101, 102 are formed on the evaporator body 10, and at least a channel hole 103 penetrating the retaining holes 101, 102.

Figure 2:
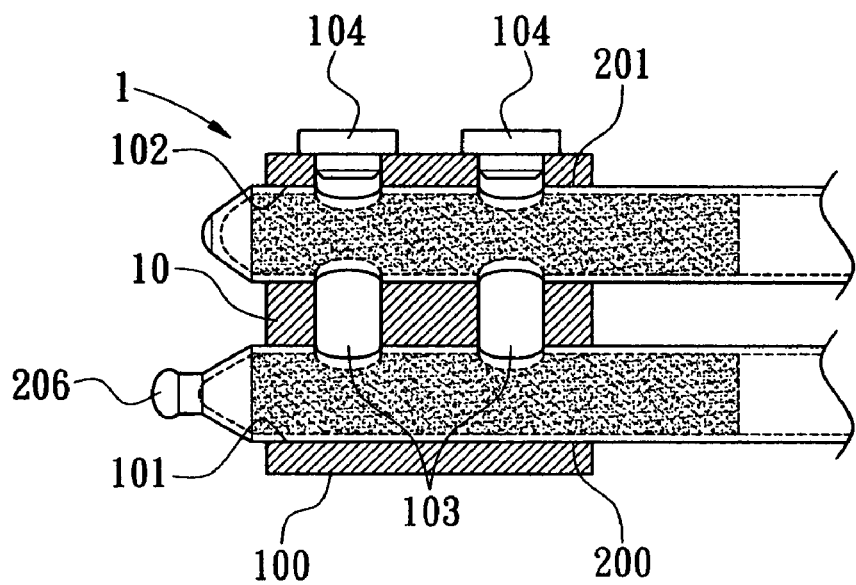
FIG. 2 is an enlarged view of the evaporator of the loop heat pipe of the present invention.
Figure 3:
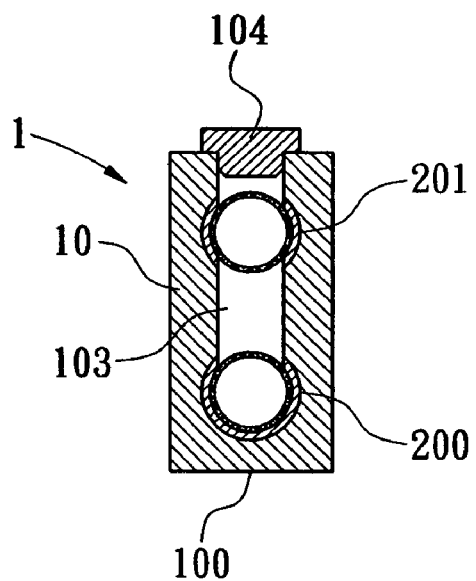
FIG. 3 illustrates the evaporator shown in FIG. 2 in another viewing angle.
Figure 5:
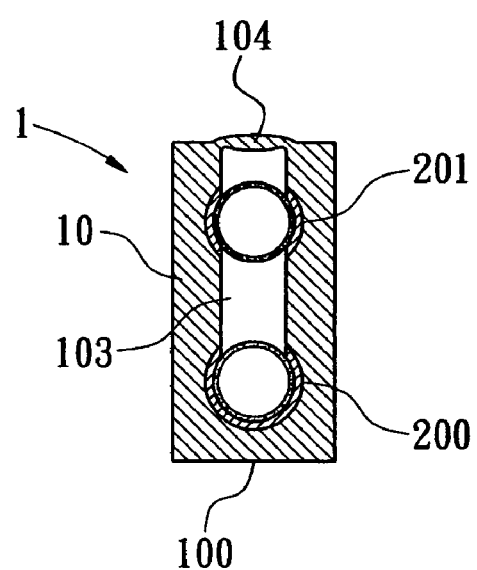
FIG. 5 illustrates the third embodiment of the present invention.
Figure 4:
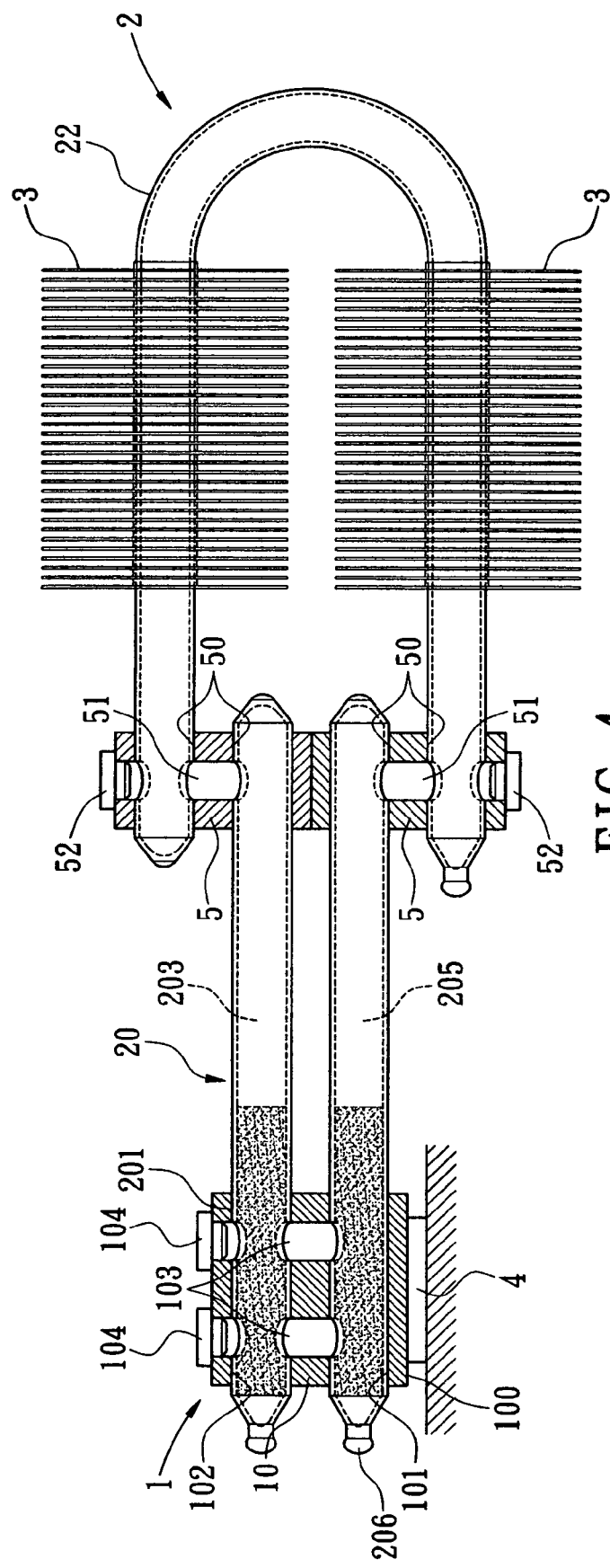
FIG. 4 is a sectional view illustrating a loop heat pipe, in accordance with the second embodiment of the present invention.

The sealed pipe 2 is a bent pipe body 20. Alternatively, the sealed pipe 2 is composed of two or more pipes 20, 21, 22 (as shown in FIG. 4) sequentially connected to each other. A capillary structure is adhered to the inner wall of the pipe body 20. In this particular embodiment, the sealed pipe 2 includes a bent pipe body 20 forming a U-shape. The pipe body 20 includes two sealed ends 200, 201. The two sealed ends 200, 201 are penetrated to the two retaining holes 101, 102 of the evaporator body 10, and soldered or adhered to the evaporator body 10 via a soldering material or a heat conductive glue. Later, the top portion of the evaporator body 10 penetrates the channel hole 103. Referring to FIG. 2 and FIG. 3, the channel hole 103 is a blind hole for the evaporator body 10, which is used only to penetrate the two sealed ends 200, 201, so as to combine the sealed pipe 2 and the evaporator body 10. The sealed pipe 2 can form a closed loop via the channel hole 103, as shown in FIG. 1. Meanwhile, a seal portion 104 is formed on the channel hole 103 at the top portion of the evaporator body 10. The seal portion 104 can be a plug, as shown in FIG. 3, or a soldered structure formed by a soldering procedure (as shown in FIG. 5) so as to effectively seal the channel hole 103 within the evaporator body 10. When the sealed pipe 2 and the channel hole 103 form a circulation loop, the circulation loop sequentially includes an evaporation region 202, a vapor channel 203, a condensation region 204, and a fluid channel 205. A predetermined amount of working fluid is filled into the circulation look. Further, a plurality of cooling fins 3 is disposed to the condensation region 204.

Furthermore, at least one of the two regaining holes 101, 102 of the evaporator body 10 penetrates the evaporator body 10, thereby forming a through hole. In this particular embodiment, the two retaining holes 101, 102 are both through holes. In this manner, at least one end of the sealed ends 200 of the sealed pipe 2 can protrude the evaporator 1 through the penetrable retaining hole 101. The sealed end 200 that protrudes the evaporator 1 is the end for closing the pipe body 20. Before the sealed end 200 is closed, one can perform the operations for cleaning, evacuating or exhausting the sealed pipe 2 and the channel holes 103. Once such operations are completed, the sealed end 200 is then closed via shrinking, pressing and soldering the end, thereby forming a sealed structure 206.

Consequently, a loop heat pipe of the present invention is obtained.

In addition, referring to FIG. 4, a loop heat pipe in accordance with the second embodiment of the present invention is illustrated. In this particular embodiment, the sealed pipe 2 includes two or more pipe bodies 20, 21, 22 sequentially connected with each other. Each pipe body, 20, 21, 22 is connected with a connection piece 5. The connection piece 5 provides each pipe body 20, 21, 22 to insert into the two connection holes 50 and to penetrate the two channel holes 51 of the connection hole 50. Meanwhile, a sealed portion 52 is formed outside of the connection piece 5 that penetrates through the channel hole 51. The structure of the sealed portion 52 is similar to that of the evaporator 1. However, the connection piece 5 is not limited to the use of heat conductive materials, because the primary fiction of the connection piece 5 is to communicably connect each pipe body 20, 21, 22.

In summary, the loop heat pipe of the present invention indeed satisfies the patent ability requirements of the patent law, a grant of letters patent therefore is thus respectfully requested.

Since, any person having ordinary skill in the art may readily find various equivalent alterations or modifications in light of the features as disclosed above, it is appreciated that the scope of the present invention is defined in the following claims. Therefore, all such equivalent alterations or modifications without departing from the subject matter as set forth in the following claims is considered within the spirit and scope of the present invention.

What is claimed is:

1. A loop heat pipe, comprising:
    an evaporator having an evaporator body made of a heat conductive material, the evaporator body comprising at least two retaining holes and at least a channel hole penetrating the retaining holes; and
    a sealed pipe comprising at least two sealed ends, the two sealed ends being securely fastened to the two retaining holes of the evaporator; wherein
    at least one of the two retaining holes is a through hole, which penetrates through two sides of the evaporator body, and at least one of the sealed ends protrudes the evaporator via the penetrable retaining hole,
    wherein the sealed pipe comprises two or more pipe bodies sequentially connected with each other, and
    wherein the pipe bodies are connected via a connection piece, the connection piece including two connection holes for penetrating therethrough the pipe bodies and a channel hole that penetrates the connection holes.

2. The loop heat pipe as recited in claim 1, wherein the evaporator body is made of aluminum or copper.

3. The loop heat pipe as recited in claim 1, wherein the evaporator body comprises a contact surface for contacting a heat source.

4. The loop heat pipe as recited in claim 1, wherein a sealed portion is formed on the top portion of the evaporator body at the channel hole of the evaporator.

5. The loop heat pipe as recited in claim 4, wherein the sealed portion is a plug, or a soldered structure formed by a soldering procedure.

6. The loop heat pipe as recited in claim 1, wherein the sealed pipe is a bent pipe body.

7. The loop heat pipe as recited in claim 6, wherein the sealed pipe is bent to a U-shape.

8. The loop heat pipe as recited in claim 1, wherein a sealed structure is formed at the sealed end that protrudes the evaporator.

* * * * *